(12) United States Patent
Lee (10) Patent No.: US 10,410,710 B2
(45) Date of Patent: Sep. 10, 2019

(54) SYSTEMS AND METHODS FOR PERFORMING ROW HAMMER REFRESH OPERATIONS IN REDUNDANT MEMORY

(71) Applicant: MICRON TECHNOLOGY, INC., Boise, ID (US)

(72) Inventor: Joosang Lee, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 15/855,514

(22) Filed: Dec. 27, 2017

(65) Prior Publication Data

US 2019/0198090 A1 Jun. 27, 2019

(51) Int. Cl.
  *G11C 11/406* (2006.01)
  *G11C 11/403* (2006.01)
  *G11C 11/408* (2006.01)

(52) U.S. Cl.
  CPC ...... *G11C 11/40603* (2013.01); *G11C 11/403* (2013.01); *G11C 11/4087* (2013.01)

(58) Field of Classification Search
  None
  See application file for complete search history.

(56) References Cited

U.S. PATENT DOCUMENTS

| | | | |
|---|---|---|---|
| 9,741,421 B1 * | 8/2017 | Hedden | G11C 11/406 |
| 9,799,391 B1 | 10/2017 | Wei | |
| 9,805,782 B1 | 10/2017 | Liou | |
| 2014/0177370 A1 * | 6/2014 | Halbert | G11C 11/40603 365/222 |
| 2014/0219043 A1 * | 8/2014 | Jones | G11C 8/10 365/230.06 |
| 2016/0027531 A1 | 1/2016 | Jones et al. | |
| 2016/0042782 A1 | 2/2016 | Narui et al. | |
| 2016/0196863 A1 | 7/2016 | Shin et al. | |

OTHER PUBLICATIONS

U.S. Appl. No. 15/676,424, filed Aug. 14, 2017, Joosang Lee.
U.S. Appl. No. 15/692,804, filed Aug. 31, 2017, Joosang Lee.
U.S. Appl. No. 15/800,267, filed Nov. 1, 2017, Joosang Lee.
PCT International Search Report & Written Opinion for PCT Application No. PCT/ US2018/046120 dated Nov. 26, 2018; 12 Pages.

* cited by examiner

*Primary Examiner* — Denise Tran
(74) *Attorney, Agent, or Firm* — Fletcher Yoder, P.C.

(57) ABSTRACT

Steering logic circuitry includes bit-flipping logic that determines a first neighboring redundant word line adjacent to a redundant word line of a memory bank, which also includes normal word lines. Redundant word lines include main word lines, each of which includes paired word lines. Each paired word line includes two redundant word lines. The steering logic circuitry also includes border determination logic that determines whether the redundant word line is on a border between the redundant word lines and an end of the memory bank or the normal word lines. The steering logic circuitry further includes main word line steering logic that determines a neighboring main word line that a second neighboring redundant word line adjacent to the redundant word line is disposed in, and paired word line steering logic that determines a neighboring paired word line that the second neighboring redundant word line is disposed in.

8 Claims, 8 Drawing Sheets

SYSTEMS AND METHODS FOR PERFORMING ROW HAMMER REFRESH OPERATIONS IN REDUNDANT MEMORY

BACKGROUND

Field of the Present Disclosure

Embodiments of the present disclosure relate generally to the field of semiconductor devices. More specifically, embodiments of the present disclosure relate to performing row hammer refresh operations in redundant memory.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

The memory cells may be organized as rows and columns, and each memory cell may be accessed via a memory address that includes a row address and a column address, which are processed by row and column address decoders. After a row or word line is selected or activated via the row address for a read operation, bits from all memory cells in the row are transferred into sense amplifiers that form a row buffer, from which a bit is selected via the column address. Because a read operation transfers memory cell charges into the row buffer, the memory cells may be rewritten to retain their values (e.g., prior to the read operation). Write operations decode the addresses in a similar manner, with entire rows being rewritten to change a single bit of a memory cell.

However, memory cells may lose their state (e.g., stored data bits) over time due to using capacitors that have a natural discharge rate. To prevent this loss of state, the memory cells may be periodically rewritten, a process known as refreshing. Moreover, memory cells may be susceptible to random changes in stored data, which are known as soft memory errors, and may be attributed to cosmic rays and other causes. There are different techniques that counteract soft memory errors and improve the reliability of DRAM, of which error-correcting code (ECC) memory and its advanced variants (such as lockstep memory) are most commonly used.

Increased densities of semiconductor memory device have led to physically smaller memory cells capable of storing smaller charges, resulting in lower operational noise margins, increased rates of electromagnetic interactions between the memory cells, and greater possibility of data loss. As a result, disturbance errors have been observed, being caused by cells interfering with each other's operation and manifesting as random changes in the values of bits stored in affected memory cells. In particular, frequent row or word line activations (e.g., in an "aggressor" word line) in a high density of memory cells may cause voltage fluctuations on associated word line selection lines, which may induce higher-than-natural discharge rates in capacitors belonging to nearby or adjacent word lines (e.g., "victim" word lines). If the affected memory cells are not refreshed before they lose too much charge, these disturbance errors may occur. This effect is referred to as the "row hammer effect."

Complicating the performance of refreshing a victim word line is locating the victim word line when it has been relocated to a redundant word line. Semiconductor memory devices may include redundant rows or word lines used to relocate data bits in a "normal" or non-redundant memory word line when the normal word line becomes faulty (e.g., unable to properly store data bits). In some memory devices, the redundant word lines may be addressed in a different manner than normal word lines. As such, refreshing the redundant word lines that store relocated data from normal word lines that are addressed differently than the redundant word lines may employ a different process than refreshing the normal memory word lines.

Typically, an aggressor word line address may be incremented and decremented to determine the neighboring victim word line addresses, and translation logic (of fuse logic in a memory device) may be used to translate the neighboring victim word line addresses to any associated redundant memory word line addresses. However, the translation logic may take up an undesirable amount of space in the memory device and increase the overall size of the memory device. Moreover, there may be cases where the aggressor word line has been relocated to a redundant memory word line, but the neighboring normal word lines to the aggressor word line have not. As such, typically row hammer refresh operations may refresh the neighboring normal word lines, but not the neighboring redundant word lines, thus not effectively addressing the row hammer effect.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, steering logic may be disposed near or in decoding logic and/or bank control logic of a memory device that may determine proper neighboring redundant word lines (e.g., of an aggressor redundant word line) and/or steer a row hammer refresh operation to the proper neighboring redundant word lines. In particular, bit-flipping logic may determine a first neighboring redundant word line by flipping a least significant bit of the aggressor redundant word line address. The steering logic may include border determination logic that may determine whether the aggressor word line address is on a border between redundant word lines and an end of a memory bank or a border between the redundant word lines and normal word lines, main word line steering logic that may determine a main word line (e.g., a bundle of eight redundant word lines) associated with a second neighboring redundant word line, and paired word line steering logic that may determine a paired word line associated with the second neighboring redundant word line. In this manner, the steering logic may determine proper neighboring redundant word lines and steer a row hammer refresh operation to the proper neighboring redundant word lines without using translation logic stored in fuse logic of the memory device to translate each relocated neighboring redundant word line, saving space in the memory device and decreasing the overall size of the memory device.

Figure 1:
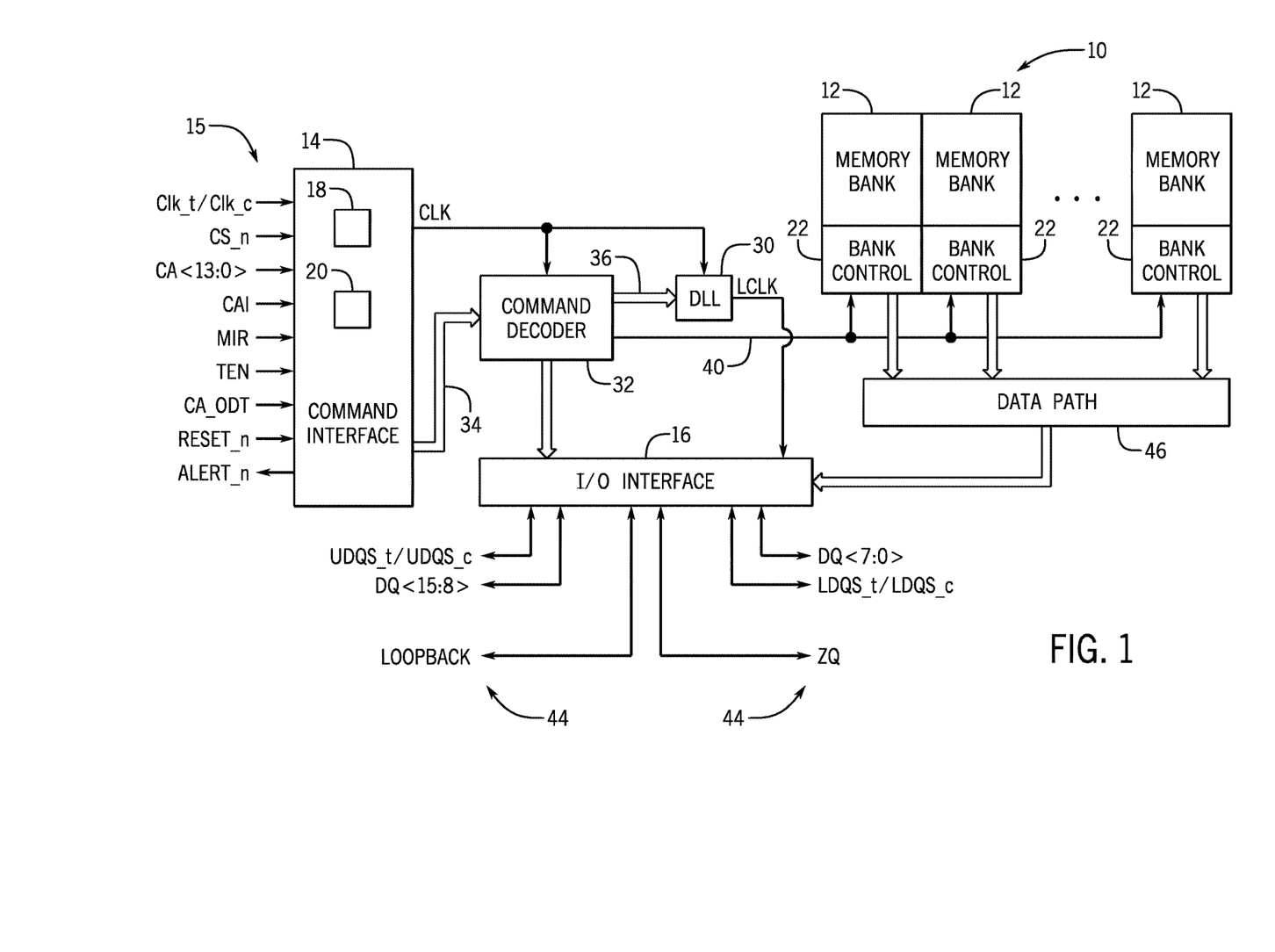
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the 110 interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
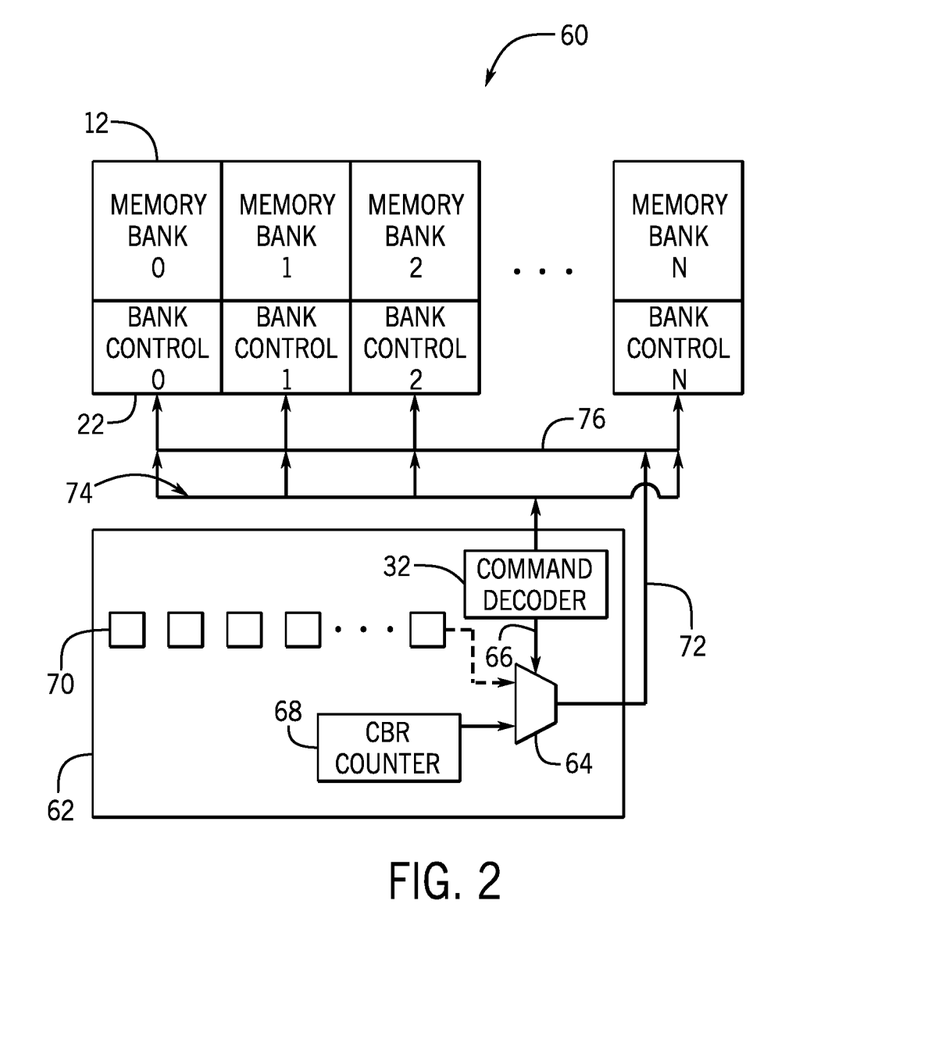
FIG. 2 is a schematic diagram of a memory system for accessing word lines of the memory device of FIG. 1, according to an embodiment of the present disclosure.

With the foregoing in mind, FIG. 2 is a schematic diagram of a memory system 60 for accessing (e.g., refreshing or activating) word lines of the memory device 10 of FIG. 1, according to an embodiment of the present disclosure. The memory system 60 may include pre-memory bank circuitry 62 that provides a word line address to the one or more bank control blocks 22 (e.g., via the command decoder 32). The pre-memory bank circuitry 62 may include a multiplexer 64 that receives a selection signal 66 from the command decoder 32 and then selects either a word line address stored in a counter 68 (e.g., a Column Access Strobe (CAS) Before Row Access Strobe (RAS) counter or a "CBR" counter) that may keep track of a word line to be refreshed or a word line address by an external input (e.g., via pads 70) based on the selection signal 66.

The selection signal 66 may be based on whether a command sent to the command decoder 32 is a refresh command (to refresh one or more word lines of one or more memory banks 12) or activate command (to activate a word line of a memory bank 12). For example, when the command is a refresh command, the multiplexer 64 may select the word line address stored in the CBR counter 68. When the command is an activate command, the multiplexer 64 may select the word line address provided by the external input.

The word line address 72 selected by the multiplexer 64 may then be sent to the command decoder 32. The command decoder 32 may decode the command (e.g., a refresh command or an activate command), and send the decoded command to the one or more bank control blocks 22 via command path 74 and word line address to the one or more bank control blocks 22 via the row address path 76. The corresponding one or more bank control blocks 22 may then refresh at least the word line address stored in the CBR counter 68 or activate at least the word line address (e.g., to perform a read or write operation) provided by the external input.

Figure 3:
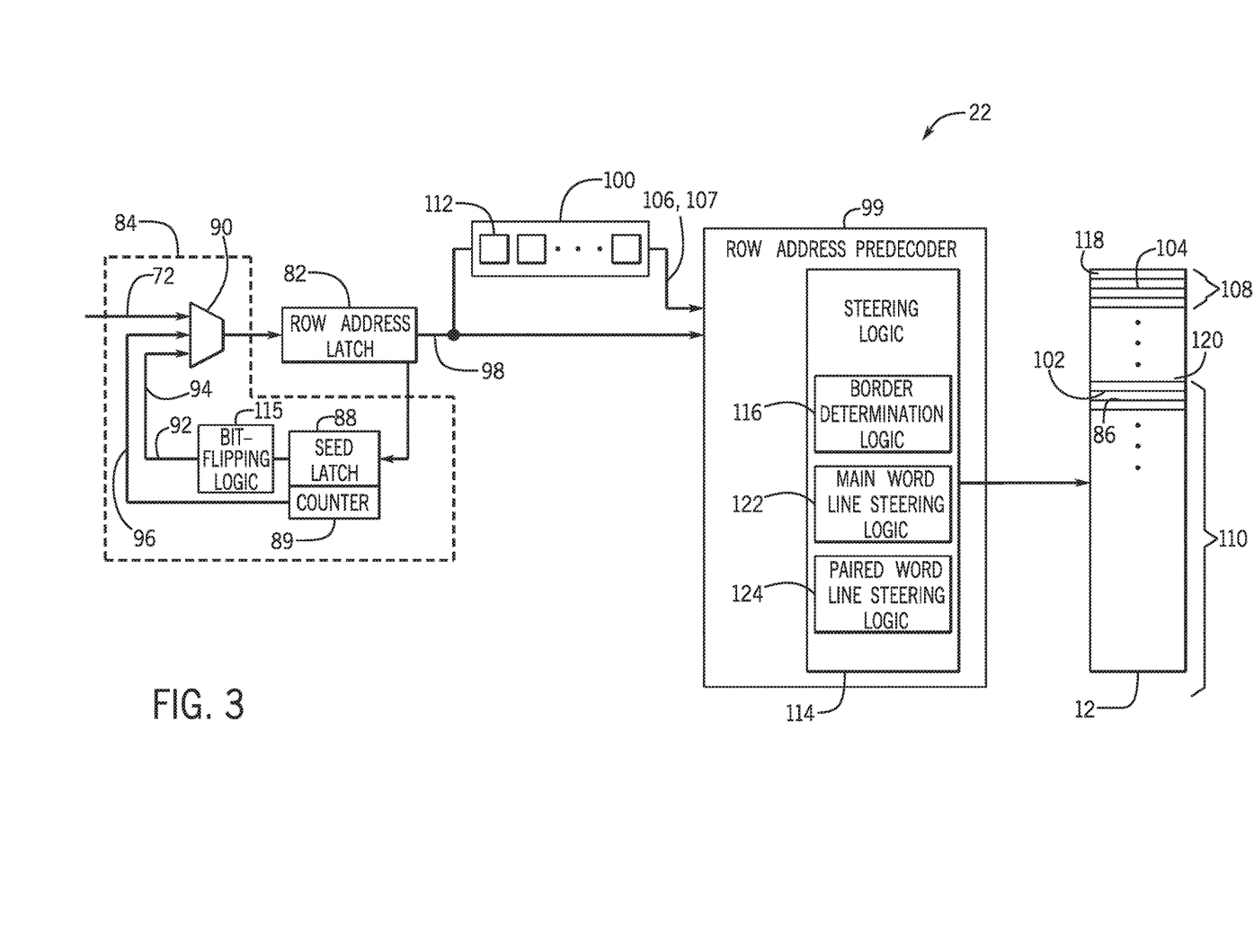
FIG. 3 is a block diagram of a bank control block of the memory device of FIG. 1 that performs row hammer refresh operations and locates relocated word lines, according to an embodiment of the present disclosure.

During normal operation of the memory device 10, rows or word lines of a memory device 10 may become faulty (e.g., unable to properly store data bits). The data in the faulty word lines may be relocated to redundant rows or word lines of the memory device 10 so that the data may be retained. However, to retrieve the relocated data, the data must first be located. FIG. 3 is a block diagram of a bank control block 22 of the memory device 10 of FIG. 1 that performs row hammer refresh operations and locates relocated word lines, according to an embodiment of the present disclosure. The bank control block 22 may include a row address latch 82 or any other suitable storage device that stores the word line address 72 (e.g., sent by the multiplexer 64 of FIG. 2).

The bank control block 22 may also include row hammer refresh circuitry 84 that performs refresh operations of the one or more word lines 86 of the one or more memory banks 12 to prevent data loss due to the row hammer effect. As illustrated, the row hammer refresh circuitry 84 includes a seed latch 88 or any other suitable storage device that stores the word line address stored in the row address latch 82 as a "seed word line address." The row hammer refresh circuitry 84 may periodically or randomly, depending on the programmed scheme, store the word line address stored in the row address latch 82 in the seed latch 88. In some embodiments, for example, for every target period of time, the row hammer refresh circuitry 84 may store the word line address stored in the row address latch 82 in the seed latch 88. Additionally, a counter 89 (e.g., a +1/−1 counter that may increment and/or decrement the seed word line address) may be used to determine neighboring word line addresses if the seed word line address is an address of a "normal" or non-redundant word line 86. If the seed word line address is instead an address of a redundant word line, then bit-flipping logic may be used (as discussed in further detail below), and the counter 89 may not be used.

Because the row hammer effect may refer to the loss or scrambling of data in neighboring (e.g., adjacent) word lines (or victim word lines) when a target word line (or aggressor word line) is activated (e.g., frequently), the bank control block 22 may refresh neighboring (e.g., adjacent) word lines of the seed word line address (e.g., seed word line address±1) to counteract the row hammer effect. As such, the row hammer refresh circuitry 84 and steering logic may include incrementing/decrementing logic that receives a seed word line address 94 stored in the seed latch 88 to determine the neighboring word line addresses of the seed word line address 92. In particular, to determine a first neighboring word line address 94, the incrementing/decrementing logic may simply flip the least significant bit of the seed word line address 92 (from 0 to 1, or vice versa). The resulting word line address 94 may be associated with a word line referred to as the "simple" neighboring word line of the seed word line (having the word line address of the seed word line address 92). However, the incrementing/decrementing logic may use more complex logic and/or time to determine the second (e.g., remaining) neighboring word line address 96 (the "complex" neighboring word line). As such, when sending signals indicative of the neighboring word line addresses 94, 96 to be refreshed, the incrementing/decrementing logic may send the simple neighboring word line address 94 first due to the shorter amount of time used to determine the simple neighboring word line address 94, and then send the complex neighboring word line address 96.

As such, the bank control block 22 may include a multiplexer 90 that may receive as an input the word line address 72 that is to be refreshed for "normal" refresh operations (e.g., those refresh operations that are performed to rewrite data in word line addresses due to data loss from read operations rather than to prevent row hammer effects) or activated for read or write operations. The multiplexer 90 may also receive as an input the simple neighboring word line address 94 to be refreshed to prevent the row hammer effect. The multiplexer 90 may further receive as an input the complex neighboring word line address 96 to be refreshed to prevent the row hammer effect. The multiplexer 90 may then output one of these word line addresses 72, 94, 96 as an output.

In any case, the word line address 72, the simple neighboring word line address 94, or the complex neighboring word line address 96 may be stored in the row address latch 82 as latched word line address 98. The latched word line address 98 may then be sent to a row address predecoder 99, which may extract or decode word line addresses from an input signal. Additionally, the latched word line address 98 may be sent to fuse logic 100 which may map a word line address corresponding to a faulty word line of the memory bank 12 to a word line address of a redundant word line of the memory bank 12. That is, in the case that the latched word line address 98 corresponds to a faulty word line (e.g., 102) that has been mapped to a redundant word line (e.g., 104), the fuse logic 100 may send the word line address (e.g., relocated word line address 106) of the redundant word line 104 to the row address predecoder 99 instead of the latched word line address 98. In some embodiments, a blocking signal 107 may be sent from the fuse logic 100 to the row address predecoder 99 to block enabling "normal" or non-redundant word lines 86 and instead enable the redundant word line 104. This way, the word line or row that stores the data to be refreshed to prevent the row hammer effect is actually refreshed. While the redundant word lines 104 are disposed in a top section 108 of the memory bank 12 and the normal word lines 86 are disposed in a bottom or remaining section 110 of the memory bank 12, it should be understood that the illustrated configuration of word lines in the memory bank 12 of FIG. 3 is only one example or embodiment, and that any suitable configuration of word lines is contemplated.

As such, the row address predecoder 99 may receive the latched word line address 98 and/or the relocated word line address 106. The row address predecoder 99 may decode a received command (e.g., a refresh command or an activate command), and send the decoded command and a word line address (e.g., the latched word line address 98 or, if there is a relocated word line address, the relocated word line address 106) to the memory bank 12 to be refreshed or activated (depending on the received command). Although the row hammer refresh circuitry 84, the word line address latch 82, and/or the fuse logic 100 are illustrated as part of the bank control logic 22 in FIG. 3, it should be understood that these components may be located in any suitable portion of the memory device 10, such as the pre-memory bank circuitry 62 illustrated in FIG. 2.

However, in some memory devices 10, the redundant word lines 104 may be addressed in a different manner than normal word lines 86. As such, each fuse block 112 of the fuse logic 100 may include translation logic that determines an address of a redundant word line that data of a target word line has been relocated to. In practice, a first fuse block 112 may receive the simple neighboring word line address 94 and, if data of the simple neighboring word line address 94 was relocated to a redundant word line, the translation logic of the first fuse block 112 would output the word line address of the redundant word line. A second fuse block 112 may also receive the complex neighboring word line address 96, and, if data of the complex neighboring word line address 96 was relocated to a redundant word line, the translation logic of the second fuse block 112 would output the word line address of the redundant word line. However, these translation logics may take up an undesirable amount of space in the memory device 10 and increase the overall size of the memory device 10.

Instead, steering logic 114 may be used to determine neighboring redundant word line addresses of a target word line address. In particular, the steering logic 114 may receive the relocated seed word line address 106 (e.g., via the row address predecoder 99) that stores the data relocated from a faulty seed word line address 92, and determine the neighboring redundant word line addresses, rather than being passed to each of the relocated seed word line address 106 and the neighboring redundant word line addresses (e.g., as determined by translation logic of the fuse logic 100). In some embodiments, the faulty seed word line address 92 and the simple neighboring word line address 94 may be replaced together due to specifications dictating that pairs of word lines 86 are replaced together. As such, the steering logic 114 may receive both the relocated seed word line 106 and the relocated seed word line address that stores the data relocated from the simple neighboring word line.

The steering logic 114 may include border determination logic 116 that may determine whether the relocated seed word line address 106 is on a border 118 of the redundant word lines 104 (e.g., between the redundant word lines 104 and an end of the memory bank 12) or a border 120 between the redundant word lines 104 and the normal word lines 86. The steering logic 114 may also include main word line steering logic 122 that may determine a main word line associated with a neighboring redundant word line. The steering logic 114 may further include paired word line steering logic 124 that may determine a paired word line associated with the neighboring redundant word line, as discussed further below.

As illustrated, the steering logic 114 is disposed in the row address predecoder 99. However, it is contemplated that the steering logic 114 may be disposed in any suitable component or portion of the memory device 10, such another portion of the bank control blocks 22 or external to the bank control blocks 22. As such, the amount or number of translation logics and even the amount or number of fuse blocks 112 in the fuse logic 100 may be reduced, thus decreasing the overall size and complexity of the memory device 10.

For timing purposes, if the memory device 10 is operating in an FGR (Fine Granularity Refresh) 1× mode, a single refresh command may perform two refresh operations on two sets of word lines of a memory bank 12. Each set of word lines may include multiple word lines of the memory banks 12. For example, a first refresh operation may refresh four word lines (e.g., corresponding to the even word line addresses 000, 010, 100, 110) of a memory bank 12 and a second refresh operation may refresh another four word lines (e.g., corresponding to the odd word line addresses 001, 011, 101, 111) of the memory bank 12. In some embodiments, there may be $2^{16}$ word lines in the memory bank 12, and the corresponding addressing scheme for the memory bank 12 may be 16 bits long (e.g., RA[15:0], where RA refers to row or word line address).

The memory device 10 may refresh its memory banks 12 by refreshing all memory banks 12 at once (using a refresh all banks "$REF_{ab}$" command) or by refreshing multiple sets of the memory banks 12 (using multiple refresh same banks "$REF_{sb}$" commands). As an example of using multiple $REF_{sb}$ commands to refresh the memory banks 12, the memory banks 12 may be divided into two sets of memory banks (e.g., even and odd memory banks), and the memory device 10 may use a $REF_{sb}$ (even) command to refresh the even memory banks and a $REF_{sb}$ (odd) command to refresh the odd memory banks.

When the memory device is operating in the FGR 1× mode, the $REF_{ab}$ command to refresh all memory banks 12 at once may be performed in approximately 195 nanoseconds (ns) and the $REF_{sb}$ command to refresh a set of the memory banks 12 may be performed in approximately 130 ns. The refresh interval for either in the FGR 1× mode may be approximately 3.9 microseconds (μs).

If the memory device is operating in an FGR 2× mode, a single refresh command may refresh one or more word lines of a memory bank 12. When the memory device is operating in the FGR 2× mode, the $REF_{ab}$ command and the $REF_{sb}$ command may each be performed in approximately 100 ns. The refresh interval for either in the FGR 1× mode may be approximately 1.95 μs.

Because preventing the row hammer effect includes refreshing two word lines (e.g., the two neighboring victim word lines to the aggressor word line), in the FGR 1× mode, for convenience, the row hammer refresh operation may use the timing of a normal refresh operation. That is, because the memory device 10 in the FGR 1× mode performs two normal refresh operations on two sets of word lines of a memory bank 12 for a single refresh command, the memory device 10 may also perform the two row hammer refresh operations (one for each of the two neighboring victim word lines) in place of or the same duration used for the single refresh command. Similarly, in the FGR 2× mode, in which the memory device 10 performs one refresh operation on one or more words of a memory bank 12 for a single refresh command, the memory device 10 may perform the two row hammer refresh operations (one for each of the two neighboring victim word lines) in place of or the same duration used for two refresh commands.

Figure 4:
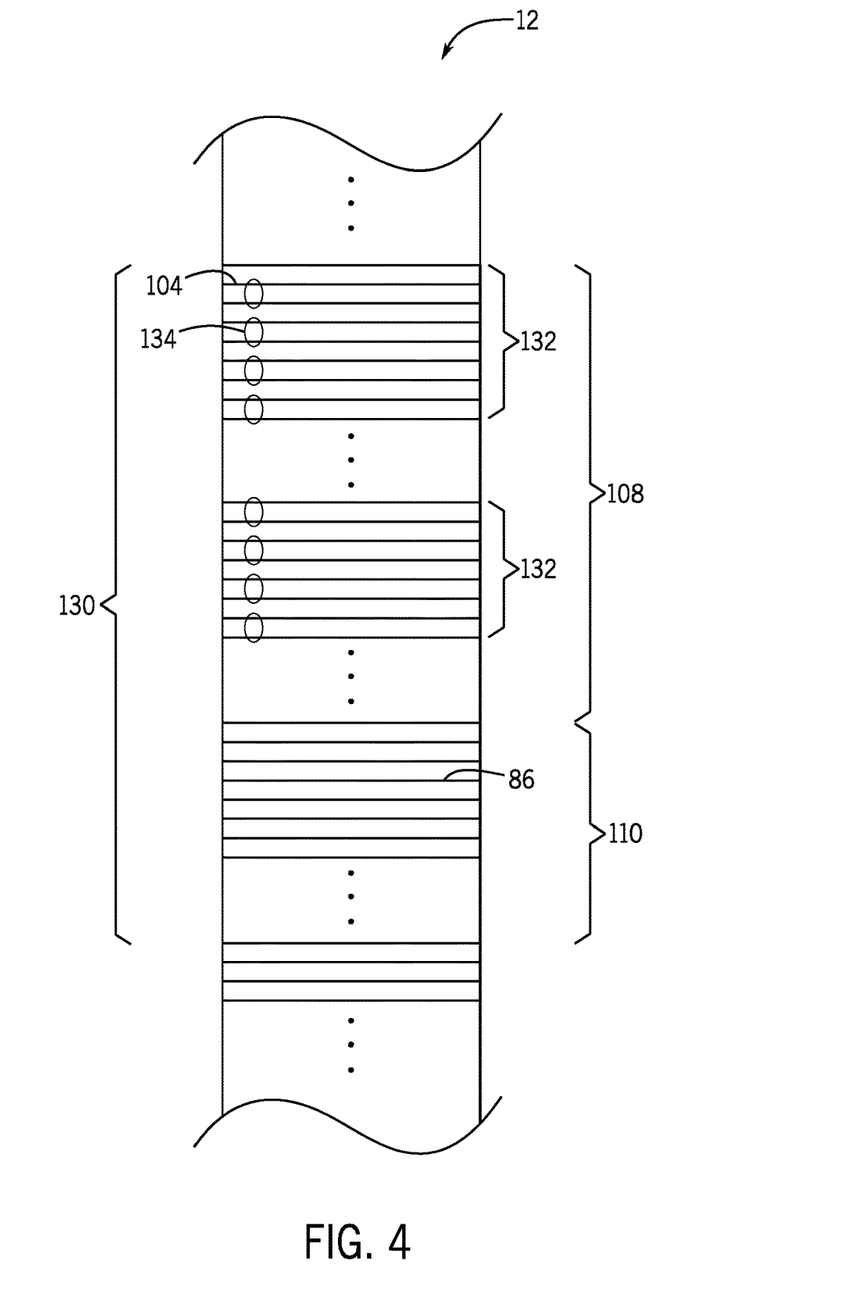
FIG. 4 is a schematic diagram of a memory bank of the memory device of FIG. 1, according to an embodiment of the present disclosure.

FIG. 4 is a schematic diagram of a memory bank 12 of the memory device 10 of FIG. 1, according to an embodiment of the present disclosure. As illustrated, the memory bank 12 may be divided into sections 130, each of which may be addressable. Each section 130 may include redundant word lines 104 that may be organized in bundles 132 of (e.g., eight) redundant word lines 104, each bundle 132 referred to as a main word line 132. Each main word line 132 may be addressable, and be further divided into pairs 134 of redundant word lines 104, also referred to as a paired or "phi" word line 134. Each paired word line 134 may also be addressable.

For instance, there may be $2^{16}$ word lines in the memory bank 12, and the corresponding addressing scheme for the memory bank 12 may be 16 bits long (e.g., RA[15:0]). As an example, the memory device 10 may be divided into sixteen (i.e., $2^4$) sections 130. As such, the first four bits (e.g., RA[15:12]) of a word line address may identify the section 130 of a word line. The next nine bits (e.g., RA[11:3]) of the redundant word line address may identify the main word line 132 of the section 130. The final three bits (e.g., RA[2:0]) of the word line address may identify the target redundant word line 104 of the main word line 132.

Due to the configuration and organization of the redundant word lines 104, the steering logic 114 may use the addressing scheme associated with the redundant word lines 104 to ensure that the proper redundant word lines 104 are refreshed to prevent the row hammer effect. In particular, to determine a first (or simple) neighboring redundant word line address, the bit-flipping logic 115 of the row hammer refresh circuitry 84 may simply flip the least significant bit of the relocated seed word line address 106 (from 0 to 1, or vice versa). In other embodiments, the fuse logic 100 and/or the row address predecoder 99 may flip the least significant bit of the relocated seed word line address 106. This is because the simple neighboring redundant word line address may be sent directly to the bank control 22 and/or the memory bank 12, as the neighboring redundant word line address may share the same paired word line 134 and the same main word line 132 as the relocated seed word line address 106. However, the steering logic 114 may use more complex logic and/or time to determine the second (or complex) neighboring redundant word line address. As such, when sending signals indicative of the neighboring redundant word line addresses to be refreshed, the steering logic 114 may send the simple neighboring redundant word line address first due to the shorter amount of time used to receive the simple neighboring redundant word line address compared to determining the complex neighboring redundant word line address, and then send the complex neighboring redundant word line address after determining the complex neighboring redundant word line address.

With this in mind, the steering logic 114 may include the border determination logic 116 that determines whether the relocated seed word line address 106 is on a border 118 of the redundant word lines 104 (e.g., between the redundant word lines 104 and an end of the memory bank 12) or a border 120 between the redundant word lines 104 and the normal word lines 86. If the relocated seed word line address 106 is on a border 118, 120, then the steering logic 114 may determine that there is no complex neighboring redundant word line address to be refreshed to prevent the row hammer effect. In some embodiments, if the relocated seed word line address 106 is on a border 120 between the redundant word lines 104 and the normal word lines 86, then the steering logic 114 may determine the last normal word line 86 (e.g., the normal word line 86 adjacent to the relocated seed word line) may be refreshed.

In addition, the steering logic 114 may include the main word line steering logic 122 that steers a row hammer refresh operation to a proper main word line 132. In particular, if the border determination logic 116 determines that the relocated seed word line address 106 is not on a border 118, 120, then the border determination logic 116 may pass the relocated seed word line address 106 to the main word line steering logic 122.

Figure 5:
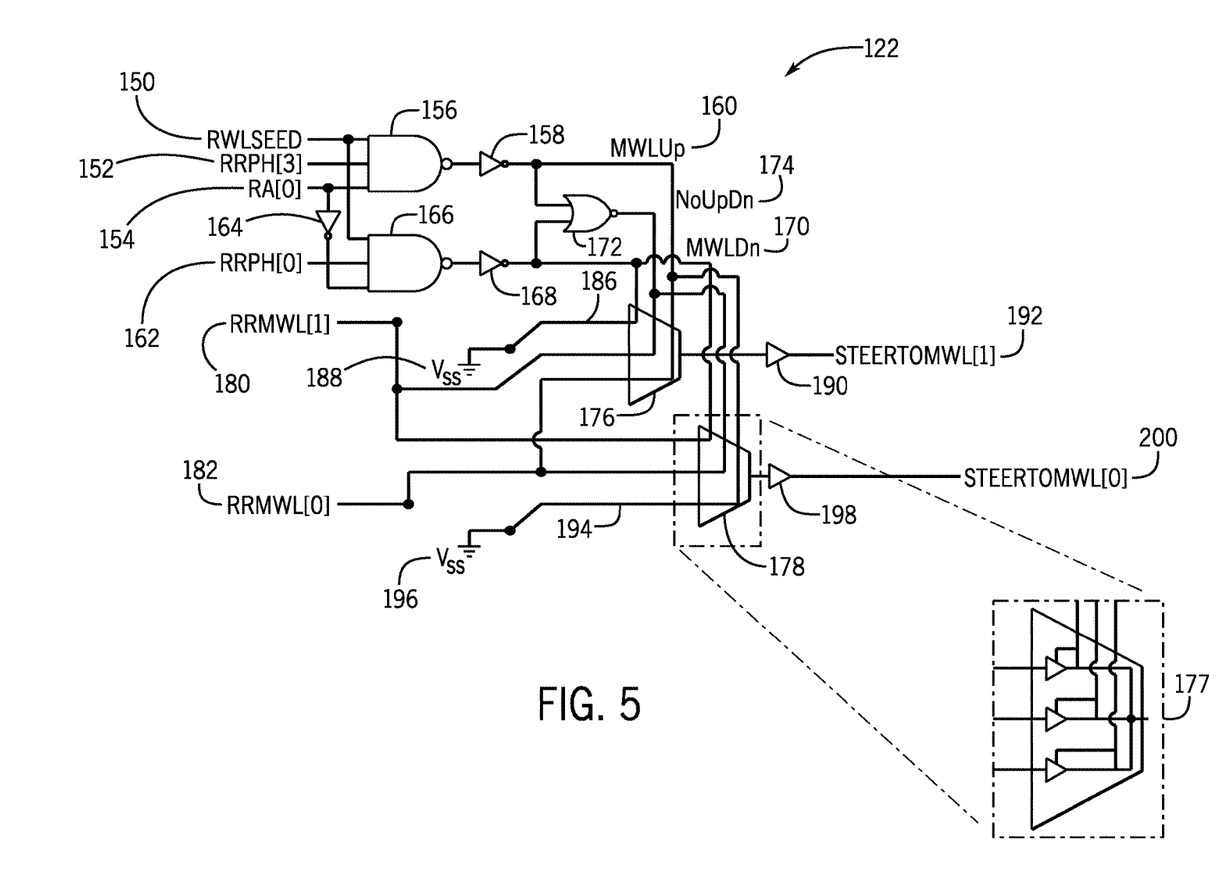
FIG. 5 is a schematic diagram of main word line steering logic of the memory device of FIG. 1, according to an embodiment of the present disclosure.

FIG. 5 is a schematic diagram of the main word line steering logic 122 of the memory device 10 of FIG. 1, according to an embodiment of the present disclosure. The main word line steering logic 122 may receive as an input a RWLSeed signal 150 from the border determination logic 116 that indicates whether an input word line address (e.g., the relocated seed word line address 106) is not on a border of the redundant word lines 104 (e.g., between the redundant word lines 104 and an end of the memory bank 12) nor a border 120 between the redundant word lines 104 and the normal word lines 86. The main word line steering logic 122 may also receive as an input a RRPH[3] signal 152 that indicates whether the input word line address is disposed in a fourth (e.g., last) paired word line 134 of a main word line 132. The main word line steering logic 122 may further receive as an input a RA[0] signal 154 that indicates a least significant bit of the input word line address. The main word line steering logic 122 may pass the signals 152, 154 to a NAND gate 156 and then an inverter 158, which may output a MWLUp signal 160 that indicates that the complex neighboring redundant word line address is disposed in a main word line 132 up or above the main word line 132 that the input word line address is disposed in.

In particular, if the RRPH[3] signal 152 is high and thus indicates that the input word line address is disposed in a fourth (e.g., last) paired word line 134 of a main word line 132, and the RA[0] signal 154 (e.g., least significant bit of the input word line address) is low, then the bit-flipping logic 115 may have determined the simple neighboring redundant word line address by flipping the least significant bit of the input word line address. As such, the complex neighboring redundant word line address is under the input word line address, and in the same main word line 132. As such, the MWLUp signal 160 may be low. However, if the RRPH[3] signal 152 and the RA[0] signal 154 are both high, then the complex neighboring redundant word line address is above the input word line address, and thus in the different main word line 132. As such, the MWLUp signal 160 may be high.

The main word line steering logic 122 may also receive as an input a RRPH[0] signal 162 that indicates whether the input word line address is disposed in a first paired word line 134 of a main word line 132. The main word line steering logic 122 may pass the RA[0] signal 154 through an inverter 164, and send the resulting signal, the RWLSeed signal 150, and the RRPH[0] signal 162 to a NAND gate 166 and then an inverter 168, which may output a MWLDn signal 170 that indicates that the complex neighboring redundant word line address is disposed in a main word line 132 down or below the main word line 132 that the input word line address is disposed in.

In particular, if the RRPH[0] signal 162 is high and thus indicates that the input word line address is disposed in a first paired word line 134 of a main word line 132, and the RA[0] signal 154 (e.g., least significant bit of the input word line address) is high, then the bit-flipping logic 115 may have determined the simple neighboring redundant word line address by flipping the least significant bit of the input word line address. As such, the complex neighboring redundant word line address is above the input word line address, and in the same main word line 132. As such, the MWLDn signal 170 may be low. However, if the RRPH[0] signal 162 is high and the RA[0] signal 154 is low, then the complex neighboring redundant word line address is below the input word line address, and thus in the different main word line 132. As such, the MWLDn signal 170 may be high.

The main word line steering logic 122 may send the MWLUp signal 160 and the MWLDn signal 170 to a NOR gate 172 to generate a NoUpDn signal 174 that indicates that the complex neighboring redundant word line address is neither in a main word line 132 below or above the main word line 132 that the input word line address is disposed in. In particular, if the NoUpDn signal 174 is high, the complex neighboring redundant word line address may be in the same main word line 132 that the input word line address is disposed in.

The main word line steering logic 122 may then send the MWLUp signal 160, the MWLDn signal 170, and the NoUpDn signal 174 to multiplexers 176, 178. The multiplexer 176 may also receive as inputs, a RRMWL[0] signal 182 that indicates a first main word line 132 that is a neighbor (e.g., below) of the main word line 132 that the input word line address is disposed in, a RRMWL[1] signal 180 that indicates a second main word line 132 that is also a neighbor (e.g., above) of the main word line 132 that the input word line address is disposed in, and a signal 186 from a VSS voltage source 188. The zoomed in window 177 illustrates routing of the multiplexer 176, as well as the multiplexer 178, and the multiplexers (i.e., 228, 230, 232, 234) in FIG. 6, discussed below. The multiplexer 176 may output a signal to a buffer 190, that in turn outputs a SteertoMWL[1] signal 192 that indicates that the steering logic 114 should steer the row hammer refresh operation to a second redundant word line of the above neighboring main word line to the main word line 132 that the input word line address is disposed in. While this example assumes two main word lines 132, it should be understood that the present disclosure applies to any suitable number of main word lines 132.

The multiplexer 178 may receive as inputs the RRMWL[1] signal 180, the RRMWL[0] signal 182, and a signal 194 from a VSS voltage source 196. The multiplexer 178 may output a signal to a buffer 198, that in turn outputs a SteertoMWL[0] signal 200 that indicates that the steering logic 114 should steer the row hammer refresh operation to a first main redundant word line of the below neighboring main word line to the main word line 132 that the input word line address is disposed in.

The main word line steering logic 122 may then output the SteertoMWL[1] signal 192 and the SteertoMWL[0] signal 200 to indicate whether to steer the row hammer refresh operation to a different main word line 132 than the main word line 132 that the input word line address is disposed in, and to which main word line 132. It should be understood that the configuration and components shown in the schematic diagram of the main word line steering logic 122 of FIG. 5 are only examples, and that any suitable configuration and components that may steer a row hammer refresh operation to the proper main word line 132 is contemplated.

Furthermore, the steering logic 114 may include the paired word line steering logic 124 that steers a row hammer refresh operation to a proper paired word line 134. In particular, if the main word line steering logic 122 determines that the complex neighboring redundant word line is disposed in the same main word line 132 that the input word line is disposed in, then the main word line steering logic 122 may pass the relocated seed word line address 106 to the paired word line steering logic 124.

Figure 6:
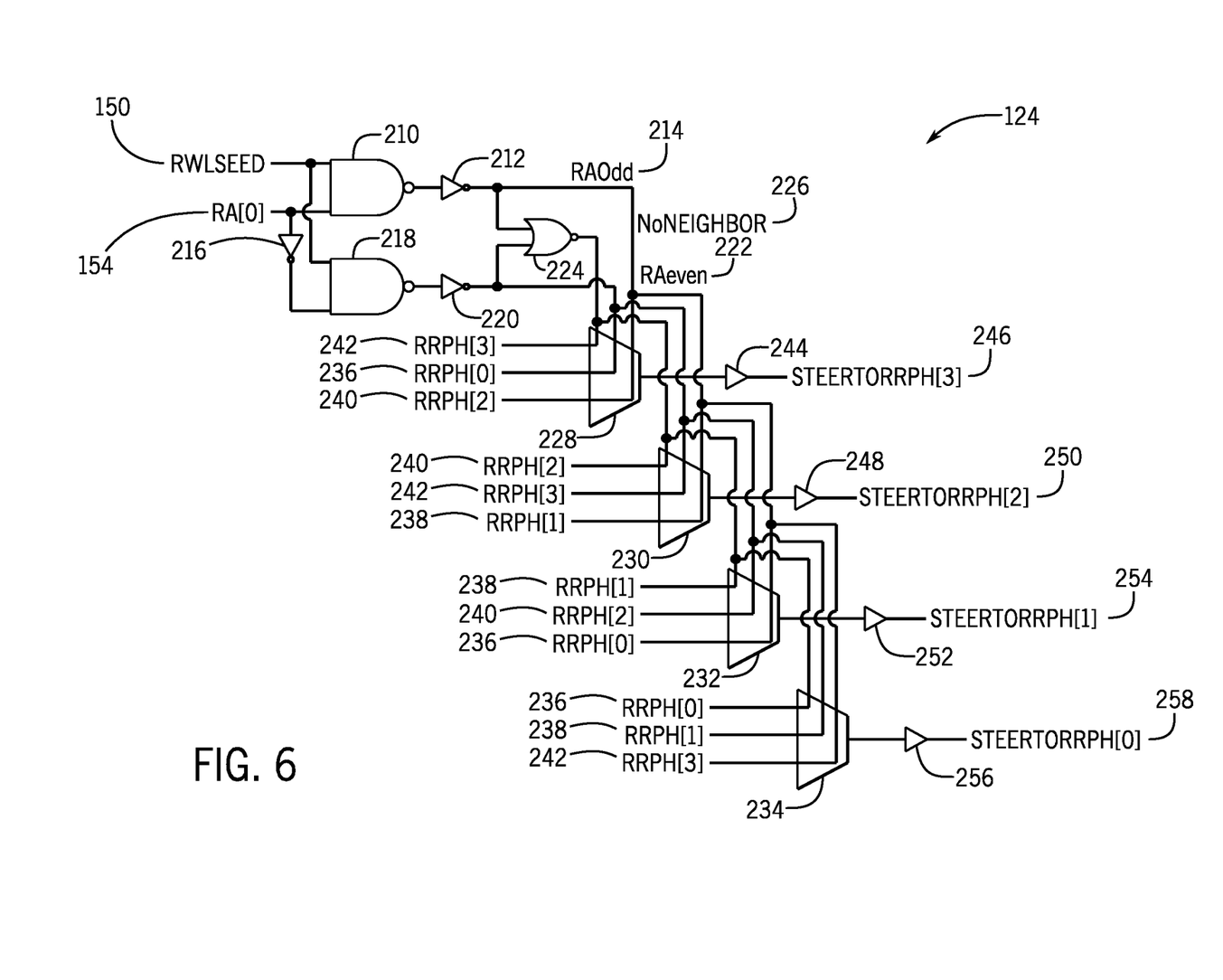
FIG. 6 is a schematic diagram of paired word line steering logic of the memory device of FIG. 1, according to an embodiment of the present disclosure.

FIG. 6 is a schematic diagram of the paired word line steering logic 124 of the memory device 10 of FIG. 1, according to an embodiment of the present disclosure. The paired word line steering logic 124 may receive as an input the RWLSeed signal 150 from the border determination logic 116 that indicates whether an input word line address (e.g., the relocated seed word line address 106) is not on a border of the redundant word lines 104 (e.g., between the redundant word lines 104 and an end of the memory bank 12) nor a border 120 between the redundant word lines 104 and the normal word lines 86. The paired word line steering logic 124 may receive as an input the RA[0] signal 154 that indicates a least significant bit of the input word line address. The paired word line steering logic 124 may pass the signals 150 and 154 to a NAND gate 210 and then an inverter 212, which may output an RAOdd signal 214 that indicates whether the input word line address (e.g., the least significant bit of the input word line address) is odd. The paired word line steering logic 124 may also pass the RA[0] signal 154 through an inverter 216, and send the resulting signal and the RWLSeed signal 150 to a NAND gate 218 and then an inverter 220, which may output an RAEven signal 222 that indicates whether the input word line address is even. The paired word line steering logic 124 may send the RAOdd signal 214 and the RAEven signal 222 to a NOR gate 224 to generate a NoNeighbor signal 226 that indicates that the input word line may not have a neighboring redundant word line because the paired word line steering logic 124 may be used for normal refresh operations (e.g., those refresh operations that are performed to rewrite data in word line addresses due to data loss from read operations rather than to prevent row hammer effects) or activated for read or write operations, and when data of the seed word line has not been relocated to a redundant word line.

The paired word line steering logic 124 may then send the RAOdd signal 214, the RAEven signal 222, and the NoNeighbor signal 226 to multiplexers 228, 230, 232, 234. Each multiplexer 228, 230, 232, 234 may receive as inputs three signals of a set of four signals 236, 238, 240, 242 associated with the paired word lines 134 of the main word line 132 that the input word line address is disposed in. As illustrated, the multiplexer 228 receives a RRPH[3] signal 242 that is associated with a fourth paired word line 134 of the main word line 132 that the input word line address is disposed in, a RRPH[0] signal 236 that is associated with a first paired word line 134 of the main word line 132 that the input word line address is disposed in, and a RRPH[2] signal 240 that is associated with a third paired word line 134 of the main word line 132 that the input word line address is disposed in. The multiplexer 228 may output a signal to a buffer 244, that in turn outputs a SteertoRRPH[3] signal 246 that indicates that the steering logic 114 should steer the row hammer refresh operation to the fourth paired word line 134 of the main word line 132 that the input word line address is disposed in.

Similarly, the multiplexer 230 may receive the RRPH[2] signal 240, the RRPH[3] signal 242, and a RRPH[1] signal 238 that is associated with a second paired word line 134 of the main word line 132 that the input word line address is disposed in. The multiplexer 230 may output a signal to a buffer 248, that in turn outputs a SteertoRRPH[2] signal 250 that indicates that the steering logic 114 should steer the row hammer refresh operation to the third paired word line 134 of the main word line 132 that the input word line address is disposed in.

Additionally, the multiplexer 232 may receive the RRPH [1] signal 238, the RRPH[2] signal 240, and the RRPH[0] signal 236, and may output a signal to a buffer 252, that in turn outputs a SteertoRRPH[1] signal 254 that indicates that the steering logic 114 should steer the row hammer refresh operation to the second paired word line 134 of the main word line 132 that the input word line address is disposed in.

Furthermore, the multiplexer 234 may receive the RRPH [0] signal 236, the RRPH[1] signal 238, and the RRPH[3] signal 242, and may output a signal to a buffer 256, that in turn outputs a SteertoRRPH[0] signal 258 that indicates that the steering logic 114 should steer the row hammer refresh operation to the first paired word line 134 of the main word line 132 that the input word line address is disposed in.

The paired word line steering logic 124 may then output the SteertoRRPH[3] signal 246, the SteertoRRPH[2] signal 250, the SteertoRRPH[1] signal 254, and the SteertoRRPH [0] signal 258 to indicate which paired word line 134 of the main word line 132 that the input word line address is disposed in to steer the row hammer refresh operation to. It should be understood that the configuration and components shown in the schematic diagram of the paired word line steering logic 134 of FIG. 6 are only examples, and that any suitable configuration and components that may steer a row hammer refresh operation to the proper paired word line 134 is contemplated. In this manner, the steering logic 114 may determine proper neighboring redundant word lines and/or steer a row hammer refresh operation to the proper neighboring redundant word lines without using translation logic stored in the fuse logic 100 to translate each relocated neighboring redundant word line, saving space in the memory device 10 and decreasing the overall size of the memory device 10.

Figure 7:
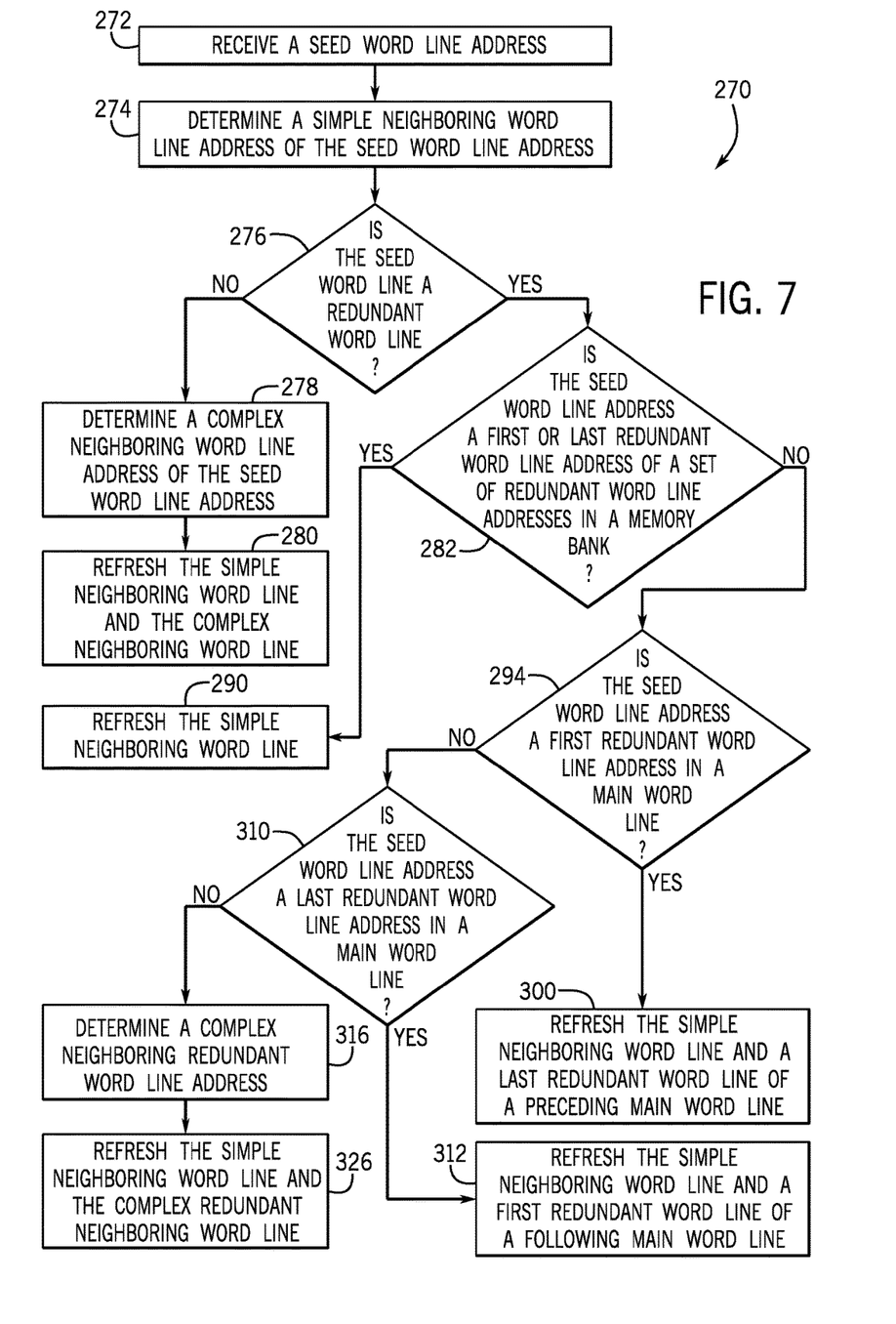
FIG. 7 is a flow diagram of a method for determining proper neighboring redundant word lines and/or steering a row hammer refresh operation to the proper neighboring redundant word lines of the memory device of FIG. 1, according to an embodiment of the present disclosure.

FIG. 7 is a flow diagram of a method 270 for determining proper neighboring redundant word lines and/or steering a row hammer refresh operation to the proper neighboring redundant word lines of the memory device 10 of FIG. 1, according to an embodiment of the present disclosure. The method 270 may be performed by any suitable device or combination of devices that may flip a least significant bit of a seed word line address, determine whether the seed word line address is a first or last redundant word line address of a memory bank, determine whether the redundant word line address is a first or last redundant word line address a main word line, and refresh word lines. While the method 270 is described using steps in a specific sequence, it should be understood that the present disclosure contemplates that the described steps may be performed in different sequences than the sequence illustrated, and certain described steps may be skipped or omitted altogether. In some embodiments, at least some of the steps of the method 270 may be performed by the steering logic 114, as described below. However, it should be understood that any suitable logic, circuitry, or component may perform the method 270, such as the steering logic 114, the refresh circuitry 84, the counter 89, the fuse logic 100, the row address predecoder 99, and the like.

As illustrated, the refresh circuitry 84 receives (process block 272) a seed word line address (e.g., an aggressor word line address). In particular, the seed word line address may be stored in the seed latch 88.

The bit flipping logic 115 determines (process block 274) a simple neighboring word line address of the seed word line address. For example, the bit-flipping logic 115 may flip the least significant bit of the seed word line address to determine the simple neighboring redundant word line address of the seed word line address. As such, if a least significant bit of the seed word line address is 0, the bit-flipping logic 115 may flip the least significant bit to 1 to determine the simple neighboring redundant word line address. If the least significant bit of the seed word line address is 1, the bit-flipping logic 115 may flip the least significant bit to 0 to determine the simple neighboring redundant word line address.

The fuse logic 100 determines (decision block 276) whether the seed word line (with the seed word line address) is a redundant word line. That is, the fuse logic 100 may determine whether the contents of the seed word line has been relocated to a redundant word line. In particular, the redundant word line address may be a relocated seed word line address 106 (e.g., in the row address predecoder 99) that is associated with a redundant word line (e.g., 104) that stores data relocated from a faulty seed word line address (e.g., 92).

If fuse logic 100 determines that the seed word line is not a redundant word line, the refresh circuitry 84 may determine (process block 278) a complex neighboring word line address of the seed word line address. In some embodiments, if a least significant bit of the seed word line address is 0, the counter 89 may determine that the complex neighboring word line address by performing a "−1" operation on the seed word line address to realize the word line address immediately preceding the seed word line address. If the least significant bit of the seed word line address is 1, the counter 89 may determine that the complex neighboring word line address by performing a "+1" operation on the seed word line address to realize the word line address immediately following the seed word line address. The refresh circuitry 84 may then refresh (process block 280) the simple neighboring word line address and the complex word line address.

Figure 8:
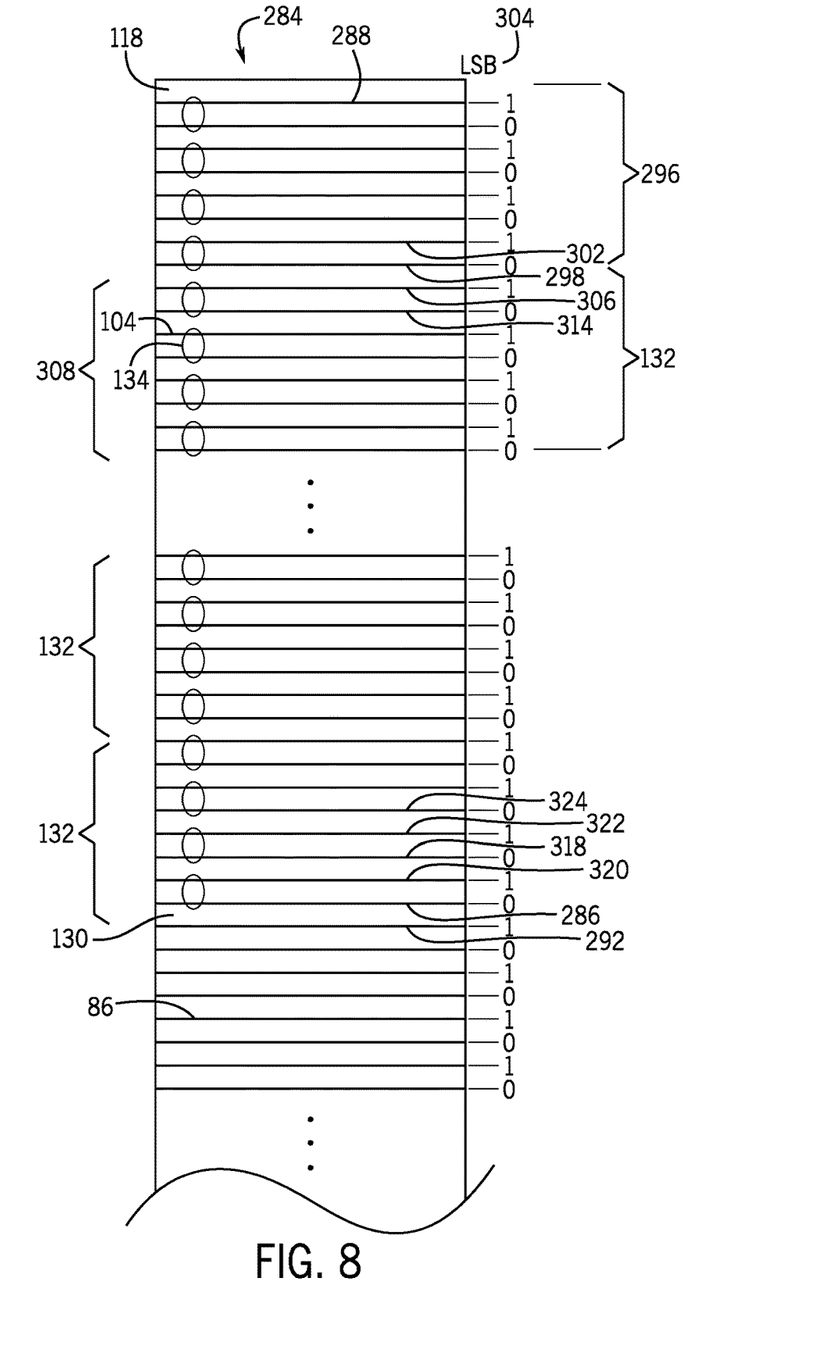
FIG. 8 is a schematic diagram of a memory bank of the memory device 10 of FIG. 1 that illustrates steps of the method of FIG. 7, according to an embodiment of the present disclosure.

If the refresh circuitry 84 determines (from decision block 276) that the seed word line is a redundant word line, then the steering logic 114 may receive the seed word line and determine (decision block 282) whether the seed word line address is a first (e.g., bottommost) or last (e.g., topmost) redundant word line address of a set of redundant word lines addresses in a memory bank. That is, the steering logic 114 (or border determination logic 116) may determine whether the redundant word line is disposed on a border 118 between the redundant word lines 104 and an end of the memory bank 12 or a border 120 between redundant word lines 104 and normal word lines 86. FIG. 8 is a schematic diagram of a memory bank 284 of the memory device 10 of FIG. 1 that illustrates steps of the method 270, according to an embodiment of the present disclosure. In particular, the following discussion of the method 270 as illustrated in FIG. 7 may refer to elements shown in FIG. 8. For example, redundant word line 286 is disposed on the border 118 and redundant word line 288 is disposed on the border 120. Moreover, the memory bank 284 includes a first redundant word line 286 (having the first redundant word line address of the set of redundant word line addresses in the memory bank 284) and a last redundant word line 288 (having the last redundant word line address of the set of redundant word line addresses in the memory bank 284).

If the steering logic 114 determines (from decision block 282) that the seed word line address is the first or last redundant word line address of the set of redundant word lines addresses in the memory bank, the steering logic 114 may refresh (process block 290) the simple neighboring word line. There may be no complex neighboring redundant word line of the last redundant word line 288 because the last redundant word line 288 is disposed on the border 118. As such, the steering logic 114 may not refresh a complex neighboring redundant word line. That is, in response to the border determination logic 116 determining that the redundant word line is disposed on a border 118 between the redundant word lines 104 and an end of the memory bank 12 or a border 120 between redundant word lines 104 and normal word lines 86, the steering logic 114 may not use the main word line steering logic 122 (e.g., the main word line steering logic 122 may not be configured to) determine the complex neighboring redundant word line. In some embodiments, the steering logic 114 may refresh a neighboring (e.g., the last) normal word line 292 (e.g., that is adjacent to the first redundant word line 286).

If the steering logic 114 determines (from decision block 282) that the seed word line address is not the first or last redundant word line address of the set of redundant word lines addresses in the memory bank, the steering logic 114 may determine (decision block 294) whether the seed word line address is a first (e.g., bottommost) redundant word line address in a main word line. For example, a main word line 296 of the memory bank 284 includes a first redundant word line 298 (having the first redundant word line address in the main word line 296).

If the steering logic 114 determines (from decision block 294) that the seed word line address is the first redundant word line address in the main word line, then the steering logic 114 may refresh (process block 300) the simple neighboring word line and a last redundant word line of a (immediately) preceding main word line. That is, the steering logic 114 may determine the seed word line is redundant word line 298. As such, the steering logic 114 has determined (in process block 274) the address of the simple neighboring word line 302 of the seed word line 298 by flipping a least significant bit 304 of the seed word line address (from 0 to 1). Furthermore, the steering logic 114 may determine the complex neighboring word line as the last redundant word line 306 of the preceding main word line 308.

If the steering logic 114 determines (from decision block 294) that the seed word line address is not the first redundant word line address in the main word line, then the steering logic 114 may determine (decision block 310) whether the seed word line address a last (e.g., topmost) redundant word line address in a main word line. For example, the main word line 308 of the memory bank 284 includes the last redundant word line 306 (having the last redundant word line address in the main word line 308).

If the steering logic 114 determines (from decision block 310) that the seed word line address is the last redundant word line address in the main word line, then the steering logic 114 may refresh (process block 312) the simple neighboring word line and a first redundant word line of a (immediately) following main word line. That is, the steering logic 114 may determine the seed word line is redundant word line 306. As such, the steering logic 114 has determined (in process block 274) the address of the simple neighboring word line 314 of the seed word line 306 by flipping the least significant bit 304 of the seed word line address (from 1 to 0). Furthermore, the steering logic 114 may determine the complex neighboring word line as the first redundant word line 298 of the following main word line 296.

If the steering logic 114 determines (from decision block 310) that the seed word line address is not the last redundant word line address in the main word line, then the steering logic 114 may determine (process block 316) a complex neighboring redundant word line address (e.g., that is in the same main word line as the seed word line address). In particular, if a least significant bit of the seed word line address is 0, the steering logic 114 may determine that the word line address immediately preceding the seed word line address is the complex neighboring word line address. For example, if redundant word line 318 is the seed word line and has an address having the least significant bit 304 of 0, the complex neighboring word line address is the address of the word line 320 immediately preceding the seed word line 318. In this case, the steering logic 114 may have determined (in process block 274) the simple neighboring word line address is the address of the word line 322, which may have been found by flipping the least significant bit 304 of the seed word line address (from 0 to 1).

If the least significant bit of the seed word line address is 1, the steering logic 114 may determine that the word line address immediately following the seed word line address is the complex neighboring word line address. For example, if redundant word line 322 is the seed word line and has an address having the least significant bit 304 of 1, the complex neighboring word line address is the address of the word line 324 immediately following the seed word line 322. In this case, the steering logic 114 may have determined (in process block 274) the simple neighboring word line address is the address of the word line 318, which may have been found by flipping the least significant bit 304 of the seed word line address (from 1 to 0).

The steering logic 114 then may refresh (process block 326) the simple neighboring word line and the complex neighboring redundant word line. While the method 270 illustrates refreshing the simple neighboring word line after certain determinations (e.g., at process blocks 290, 300, 312, 326), it should be understood that refreshing the simple neighboring word line may occur at any suitable time after the simple neighboring word line address is determined (at process block 274). That is, refreshing the simple neighboring word line may be performed as early as immediately after the simple neighboring word line address is determined (at process block 274). As such, refreshing the simple neighboring word line and refreshing the complex redundant neighboring word line, as shown in process block 326, for example, may be performed at different times.

In this manner, the method 270 may determine proper neighboring redundant word lines and/or steering a row hammer refresh operation to the proper neighboring redundant word lines of the memory device 10, without using translation logic stored in the fuse logic 100 to translate each neighboring redundant word line. Eliminating the need for the translation logic may save space in the memory device 10 and decrease the overall size of the memory device 10.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method comprising:
receiving a redundant word line address associated with a redundant word line of a set of redundant word lines of a memory bank, wherein the memory bank comprises a set of normal word lines, wherein the set of redundant word lines comprises a plurality of main word lines, wherein data of a normal word line of the set of normal word lines is configured to be relocated to the redundant word line;
determining a first neighboring redundant word line adjacent to the redundant word line;
determining whether the redundant word line is a first redundant word line or a last redundant word line of the memory bank;
refreshing the first neighboring redundant word line in response to determining that the redundant word line is the first redundant word line or the last redundant word line of the memory bank;
determining whether the redundant word line is a first redundant word line of a main word line of the plurality of main word lines;
refreshing the first neighboring redundant word line and a last redundant word line of an immediately preceding main word line of the main word line in response to determining that the redundant word line is the first redundant word line of the main word line;
determining whether the redundant word line is a last redundant word line of the main word line; and
refreshing the first neighboring redundant word line and a first redundant word line of an immediately following main word line of the main word line in response to determining that the redundant word line is the last redundant word line of the main word line.

2. The method of claim 1, comprising:
determining a complex neighboring redundant word line in the main word line; and
refreshing the complex neighboring redundant word line in response to determining the complex neighboring redundant word line.

3. The method of claim 2, wherein determining the complex neighboring redundant word line occurs in response to determining that the redundant word line is not the first redundant word line of the main word line nor the last redundant word line of the main word line.

4. The method of claim 3, wherein determining the complex neighboring redundant word line occurs in response to determining that the redundant word line is not the first redundant word line nor the last redundant word line of the memory bank.

5. The method of claim 2, wherein the complex neighboring redundant word line immediately precedes the redundant word line when a least significant bit of the redundant word lines is 0.

6. The method of claim 2, wherein the complex neighboring redundant word line immediately follows the redundant word line when a least significant bit of the redundant word lines is 1.

7. The method of claim 1, wherein determining whether the redundant word line is the first redundant word line of the main word line occurs in response to determining that the redundant word line is not the first redundant word line nor the last redundant word line of the memory bank.

8. The method of claim 1, wherein determining whether the redundant word line is the last redundant word line of the main word line occurs in response to determining that the redundant word line is not the first redundant word line nor the last redundant word line of the memory bank.

* * * * *